(12) United States Patent
Shi et al.

(10) Patent No.: US 7,309,912 B1
(45) Date of Patent: Dec. 18, 2007

(54) ON-PACKAGE EDGE-MOUNT POWER DECOUPLING AND IMPLEMENTATION WITH NOVEL SUBSTRATE DESIGN FOR FPGA AND ASIC DEVICES

(75) Inventors: Hong Shi, Santa Rosa, CA (US); Yuanlin Xie, Fremont, CA (US); Tarun Verma, Fremont, CA (US)

(73) Assignee: Altera Corporation, San Jose, CA (US)

(*) Notice: Subject to any disclaimer, the term of this patent is extended or adjusted under 35 U.S.C. 154(b) by 0 days.

(21) Appl. No.: 11/478,017

(22) Filed: Jun. 28, 2006

(51) Int. Cl.
*H01L 23/48* (2006.01)

(52) U.S. Cl. .................. 257/678; 257/723

(58) Field of Classification Search ......... 257/924, 257/678, 723
See application file for complete search history.

(56) References Cited

U.S. PATENT DOCUMENTS 7,081,661 B2 * 7/2006 Takehara et al. ............. 257/433
7,230,317 B2 * 6/2007 Pearson et al. ............. 257/532

* cited by examiner

*Primary Examiner*—Roy Potter
(74) *Attorney, Agent, or Firm*—Beyer Weaver LLP (57) ABSTRACT

A package substrate is provided with a side/edge-mounted decoupling capacitor that can provide substantially instant power or control simultaneous switching noise (SSN) associated with a semiconductor device package. A fabrication method for such a package substrate is also provided. Further, a semiconductor device package that includes such a package substrate is provided. According to various embodiments, the decoupling capacitor is connected to edges or sides of a power plane and a ground plane in the package substrate for connection via the semiconductor device package's power delivery system to a power source or component.

16 Claims, 4 Drawing Sheets

ON-PACKAGE EDGE-MOUNT POWER DECOUPLING AND IMPLEMENTATION WITH NOVEL SUBSTRATE DESIGN FOR FPGA AND ASIC DEVICES

BACKGROUND OF THE INVENTION

1. Field of the Invention

This invention relates generally to semiconductor device packages. More specifically, the invention relates to package substrates with side/edge-mounted decoupling capacitors and their corresponding methods of fabrication.

2. Description of the Prior Art

A semiconductor device package is generally coupled to a printed circuit board (PCB) and powered by a system power supply located thereon. The system power supply is often connected to a system ground (ideally at a voltage potential of 0 Volts). The system power supply is also connected through power and ground leads to the package's power and ground planes for operating the semiconductor device package. Since the system power supply is often located a substantial distance away from the package, a long time delay and large inductance associated with the power and ground leads are introduced into the package's power delivery system. The package's power delivery system includes among other things all the connections between the package components (e.g., drivers) and their power sources (e.g., system power supply). As a result, the package components as well as the package as a whole operate in a suboptimal manner.

During its operation, a semiconductor device package may experience some degree of simultaneous switching noise (SSN). This may occur when multiple drivers switch simultaneously causing a voltage ripple in the device's power delivery system and offsetting the voltage reference within the semiconductor device package from its specified value. This voltage reference shift is commonly known as SSN and is exacerbated by the increased number of multiple drivers switching simultaneously in today's semiconductor device packages and the large inductance introduced by the earlier mentioned power and ground leads. As a result, SSN may cause errors in the operation of the die (e.g., drivers not responding correctly). Therefore, the more SSN present, the less reliable the semiconductor device package will become.

One approach for minimizing SSN is to include decoupling capacitors (also referred to as bypass capacitors) in the package's power delivery system. Conventionally, decoupling capacitors are mounted on the top surface or bottom surface of the package substrate. The positive terminal end and negative terminal end of the decoupling capacitor are connected by vias to the power plane and ground plane respectively.

However, package space and trace routing constraints make conventional implementation of decoupling capacitors and their decoupling performances limited. For example, the top and bottom surfaces of package substrates are typically reserved for input/output (I/O) connections, especially as the number of I/O increases in more complex semiconductor device packages. The surfaces may also be reserved for receiving a package structure, such as a heat spreader or a stiffener. Therefore, a very limited number of capacitors can be mounted on the top and bottom surfaces of the package substrate resulting in a limited capacitance effect on minimizing SSN.

In addition, the use of vias for on-package decoupling capacitors increases the equivalent series inductance (ESL) value for the semiconductor device package. This is because vias typically introduce a large impedance value in the decoupling capacitor's circuit, which fundamentally limits the effectiveness of the decoupling capacitor's performance.

Accordingly, there is a need to provide improved semiconductor device packages and corresponding packaging methods that can provide substantially instant power or control the amount of SSN generated, thereby improving semiconductor device packages' performances.

SUMMARY OF THE INVENTION

To achieve the foregoing, the present invention provides a package substrate with a side/edge-mounted decoupling capacitor that can provide substantially instant power or control simultaneous switching noise (SSN) associated with a semiconductor device package. A fabrication method for such a package substrate is also provided. Further, the present invention provides a semiconductor device package that includes such a package substrate. Therefore, the side/edge-mounted decoupling capacitor provides decoupling capacitance that can deliver near instant power to the die and/or minimize the amount of SSN that would be experienced by the die.

In one aspect, the present invention provides a package substrate. The package substrate includes a top surface, a bottom surface, a side surface, and a capacitor. The top surface is configured to receive a die. The bottom surface is opposite the top surface whereas the side surface is located between the top and bottom surfaces. The capacitor is located on the side surface. The capacitor is electrically connected to a power plane and a ground plane that are located within the package substrate.

In another aspect, the present invention provides a semiconductor device package. The semiconductor device package includes a package substrate and a die. The package substrate includes a top surface, a bottom surface, a side surface, and a capacitor. The bottom surface is opposite the top surface whereas the side surface is located between the top and bottom surfaces. The capacitor is located on the side surface. The capacitor is electrically connected to a power plane and a ground plane that are located within the package substrate. The die has active and inactive surfaces. The die is positioned on the top surface and electrically connected to the packaging substrate.

In yet another aspect, the present invention provides a method of forming a package substrate. A power plane is formed on a first substrate layer such that an edge of the power plane is exposed on a side surface of the first substrate layer. A ground plane is formed on a second substrate layer such that an edge of the ground plane is exposed on a side surface of the second substrate layer. A capacitor is coupled to the edges of the power and ground planes.

These and other features and advantages of the invention will be presented in more detail below with reference to the associated drawings.

DETAILED DESCRIPTION OF SPECIFIC EMBODIMENTS

Reference will now be made in detail to specific embodiments of the invention. Examples of the specific embodiments are illustrated in the accompanying drawings. While the invention will be described in conjunction with these specific embodiments, it will be understood that it is not intended to limit the invention to such specific embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

A package substrate is provided with a side/edge-mounted decoupling capacitor that can provide substantially instant power or control simultaneous switching noise (SSN) associated with a semiconductor device package. A fabrication method for such a package substrate is also provided. Further, a semiconductor device package that includes such a package substrate is provided. According to various embodiments, the decoupling capacitor is connected to edges or sides of a power plane and a ground plane in the package substrate for connection via the semiconductor device package's power delivery system to a power source or component.

In order for a semiconductor device package to operate, a power source having power (or positive) and ground (or negative) connections is generally required. Often the power source is required to operate the drivers within the die. However, depending on the location of the power source, a different amount of time delay and SSN will occur between the drivers and the power source. One example of a power source is a decoupling capacitor (i.e., bypass capacitor). A decoupling capacitor typically stores energy when charged and can be recharged as needed. It may be used in combination with another power source (e.g., system power supply; another decoupling capacitor). When integrated in a semiconductor device package's power delivery system, the decoupling capacitor (depending on its location) can provide near instant power to the die and its components (e.g., drivers) while increasing decoupling capacitance in the semiconductor device package's power delivery system. That is, a decoupling capacitor can effectively be a source of near instant power while minimizing SSN if located relatively close (e.g., within the semiconductor device package) to the die and supplied with sufficient amounts of capacitance.

For instance, by having a shorter electrical connection between the driver and its power source, a smaller amount of resistance and inductance is introduced in the power to ground loop or between the driver and its power source. Further, by having a shorter connection (as compared to conventional implementations with vias) and larger connection area between the decoupling capacitor and the power and ground planes in the semiconductor device package, a larger amount of capacitance can be provided. As a result, a smaller voltage drop and larger decoupling capacitance can lower SSN whereas a shorter time delay can provide near instant power.

An advantage of having decoupling capacitors mounted to the sides of a package substrate in accordance to various embodiments of the present invention is to make available the possibility of providing larger amounts of capacitance (typically, in the range of a few to decades Micro-Farads depending on the application; e.g., 5 to 300 Micro-Farads) at a lower cost as compared to some other approaches. One approach involves attaching decoupling capacitors around the flip chip package on the PCB. However, this approach produces a relatively high inductive electrical path between the power source (i.e., decoupling capacitors) and the flip chip package.

Another approach is to mount the decoupling capacitors around the die, but instead on the package substrate. Unfortunately, the amount of capacitance available (typically in the range of 10 to 1000 Pico-Farads) is substantially limited by the space available on the package substrate (e.g., the area of the package substrate between the die and the heat spreader) to be effective. This is especially evident in cases where the die is large, such as in programmable logic devices.

Yet another approach is to embed the decoupling capacitor within the package substrate. Again, there is limited space (defined by micro via and PTH—plated through hole) available and increased difficulty in substrate fabrication that results in lower yields and higher costs. Finally, there is an approach to embed the decoupling capacitor in the die itself (e.g., next to the i/o buffer). However, this approach would increase the silicon die size and again result in higher costs.

Figure 1:
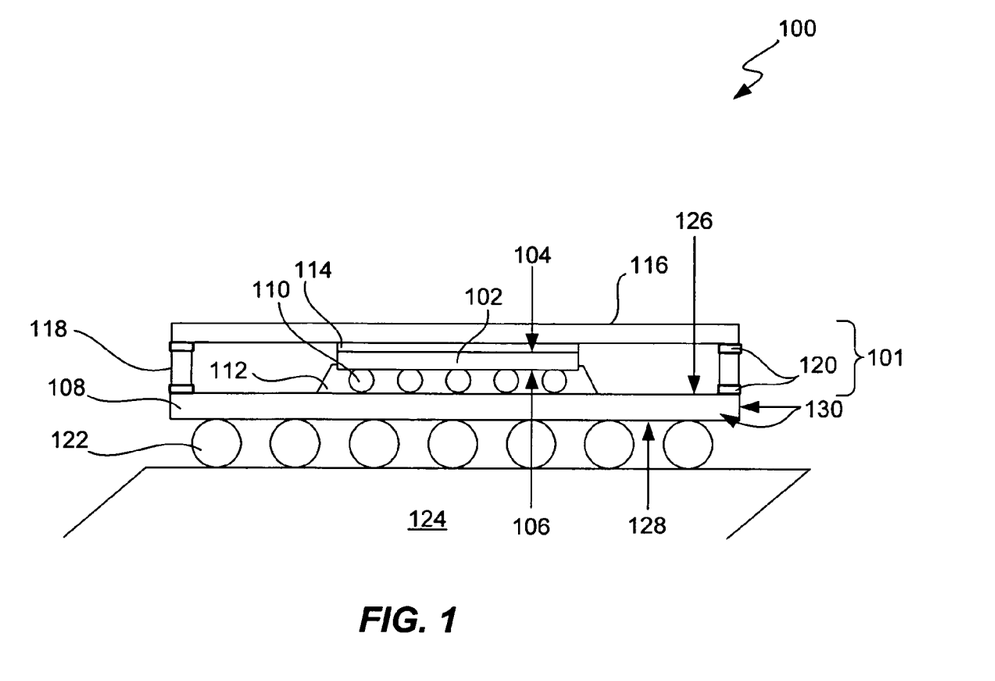
FIG. 1 illustrates a cross-sectional view of a semiconductor device package that can implement various embodiments of the present invention.

FIG. 1 illustrates a cross-sectional view of a semiconductor device package that can implement various embodiments of the present invention. As shown, flip chip package 100 includes a die 102 having a front surface 106 (i.e., active surface) and a back surface 104 (i.e., inactive surface). Die 102 may have any suitable set of dimensions. In one example, die 102 may have dimensions on the order of about 100-1089 mm$^2$ and 12-32 mils thick.

Once die 102 is chosen, die 102 is attached to a corresponding flip chip package substrate 108. Package substrate 108 may also have any suitable set of dimensions. For example, package substrate 108 may have dimensions on the order of about 400-2025 mm$^2$ (e.g., 23×23 mm, 45×45 mm). In attaching die 102 to package substrate 108, die 102 is positioned over package substrate 108 and bonded electrically and mechanically together in a solder joining operation. As shown, flip chip package substrate 108 has a top surface (die surface) 126 and a bottom surface (board surface) 128. It is important to note that the un-bonded die has an array of bumps 110 arranged on its front surface 106. Bumps 110 can be composed of any conductive material.

High lead (95Pb5Sn) and eutectic (63Sn37Pb) solder are most common bump materials. However, Au and Cu can also be used.

Prior to bonding die 102 to substrate 108, flux is applied to either the front surface 106 of the die or the top surface 126 of package substrate 108. The flux serves primarily to allow solder to wet the joining surfaces, such that the bumps 110 make good contact with pre-solder covered electrical pads (not shown) on the package substrate. It may be applied in any of a variety of methods, including brushing or spraying, or dipping the die into a thin film, thereby coating the bumps with flux. The flux generally has an acidic component, which removes oxide barriers from the solder surfaces so that a better electrical connection can be established thereon. Non-cleaning or high temperature cleaning fluxes, as are known in the art, may be used.

After the flux is applied, die 102 is aligned with and placed onto a placement site on the package substrate 108 such that the die's bumps 110 are aligned and in contact with the pre-solder covered electrical pads (not shown) on substrate 108. The pre-solder covered electrical pads are electrically connected to the electrical traces, power plane, or ground plane within the substrate. Substrate 108 is typically composed of an organic material, such as PTFE (such as Teflon™, available form Gore, Eau Claire, Wis.), bismaleimide triazine (BT) resin, and other epoxy. However, substrate 108 may also be composed of ceramic or ceramic-plastic materials. Any conventional method for fabricating substrate 108 may be used. For example, laminate and substantial build-up fabrication methods can be used. Heat, typically above 200° C. (e.g., 240° C.), is applied to one or more of the die and the package substrate, causing bumps 110 to alloy and form electrical connections between die 102 and package substrate 108. The package is then cooled to harden the connection. Then, where necessary, the remaining flux residue is substantially removed in a cleaning step, for instance by washing with an appropriate solvent.

An underfill can be optionally applied in order to enhance the mechanical bonding of the die and package substrate. In one embodiment, an underfill material 112, typically a thermo-set epoxy, such as is available from Hysol Corporation of Industry, Calif. (e.g., product numbers 4549, 8439), Ablestik Laboratories of Rancho Domingo, Calif., or Namics, Reno, Nev. (e.g., product no. 8439-1) is dispensed into the remaining space (or "gap") between die 102 and substrate 108.

In a typical procedure, a bead of thermo-set epoxy is applied along one edge of the die where it is drawn under the die by capillary action until it completely fills the gap between the die and the package substrate. Slight heating of the package substrate during dispensing of the underfill epoxy may assist the flow. In some cases, the underfill epoxy flow is further assisted by vacuum, or, alternatively, by injection of the epoxy into the gap. It should be noted that there may be other methods for applying underfill and that any underfill application may be used in conjunction with the present invention.

Underfill 112 is then cured by heating the package substrate and die to an appropriate curing temperature for the underfill material, generally about 150° C., and curing for a specific amount of time at the temperature. In this manner the process produces an electrically and mechanically bonded semiconductor device package.

Flip chip package 100 also includes an optional heat spreader 101 composed of a thermally conductive material. Heat spreader 101 may either be in a one-piece heat spreader construction or in a two-piece heat spreader construction (e.g., lid 116 and stiffener 118). That is, a heat spreader may be composed of a lid connected to the substrate via a stiffener or may also have a form that allows for direct attachment to the substrate, such as through edges or legs that descend from the flat piece overlying the die to contact the package substrate. In either case, it is referred to herein as a heat spreader. In general, heat spreaders are made of metal.

Stiffener 118 (also sometimes referred to as a "picture frame" or "window frame" due to the stiffener's appearance) is typically a flat piece of metal about 10 to 40 mils thick, having substantially the same dimensions as the package substrate with a window opening in its center to clear the die. One of the purposes of a stiffener is to provide stability to the substrate. The window opening may have a width that ranges from ⅓ to ⅔ of the overall width of the stiffener.

As shown in FIG. 1, heat spreader 101 is connected to the back surface (i.e., inactive surface) of die 102 with a thermal adhesive material 114. The connection of the heat spreader to the substrate (and optionally the stiffener) is made with an adhesive 120.

In accordance with various embodiments of the present invention, a conventional flip chip package construction is replaced by the application of a package substrate with decoupling capacitors (mounted on the package substrate edges/sides 130) that can provide increased capacitance in order to deliver near instant power to the die and/or minimize SSN. As such, flip chip package 100 can be more robust and/or reliably used when connected to a printed circuit board (PCB) 124 via a ball grid array (BGA) 122.

Figure 2:
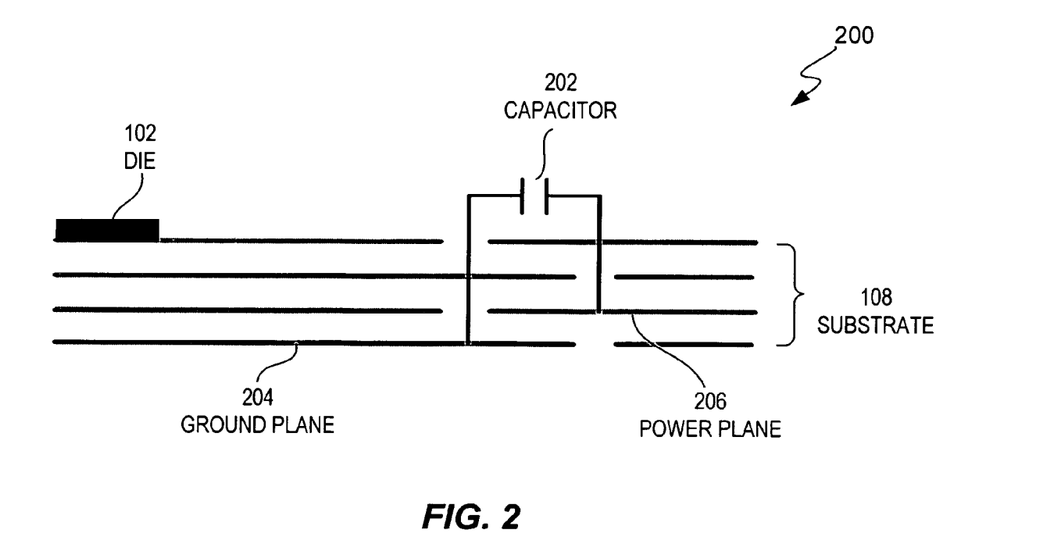
FIG. 2 illustrates a schematic diagram of a decoupling capacitor according to various embodiments of the present invention.

To further elaborate on the side/edge-mounted decoupling capacitors on substrate 108, reference will now be made to FIG. 2. FIG. 2 illustrates a schematic diagram 200 of a decoupling capacitor according to various embodiments of the present invention. As shown, a die 102 is mounted on a substrate 108. Substrate 108 includes multiple substrate layers. Substrate 108 also includes a power plane 206 and a ground plane 204. A decoupling capacitor 202 is electrically connected to the power plane 206 and ground plane 204.

Decoupling capacitor 202 is typically coupled to a power source for charging and/or an end device (e.g., die, drivers, etc.) for powering. In a preferred embodiment, the decoupling capacitor is connected to power and ground planes in the package substrate 108 for connection via the flip chip package's power delivery system to a power source and/or component.

Figure 3A:
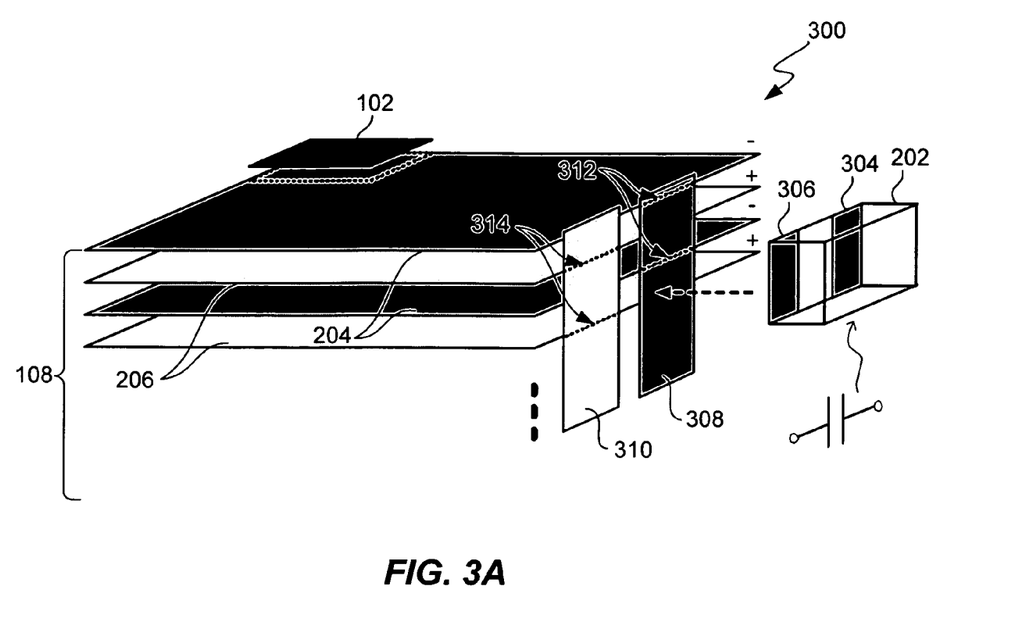
FIG. 3A illustrates a prospective view of a semiconductor device package with a substrate that includes a side/edge-mounted decoupling capacitor according to various embodiments of the present invention.

FIG. 3A illustrates a prospective view of a semiconductor device package 300 with a package substrate 108 that includes a side/edge-mounted decoupling capacitor 202 according to various embodiments of the present invention. As shown, semiconductor device package 300 includes a die 102 positioned on a top surface of package substrate 108. Package substrate 108 includes multiple substrate layers with ground planes 204 and power planes 206 formed on them. Package substrate 108 also includes at least one decoupling capacitor 202 coupled to a side/edge of the power and ground planes. In general, decoupling capacitor 202 is electrically connected to the power and ground planes.

Ground planes 204 and power planes 206 are typically associated with a package's power delivery system. As such, the ground planes 204 and power planes 206 should carry different voltage potentials. For instance, ground planes 204 may have a negative (−) or zero potential whereas power planes 206 may have a positive (+) potential. Ground planes 204 and power planes 206 are made of a conductive material (e.g., Cu) and normally grouped together in pairs. According to a specific embodiment, a dielectric material is formed between each pair of planes, thereby allowing the pair to act as a decoupling capacitor.

Side/edge 312 and 314 of the power ground planes may correspond to a side surface 130 of the package substrate. The side surface 130 of the package substrate can be located anywhere on the package substrate. For example, the side/edge 130 may be located on the periphery of the package substrate (see FIG. 1) or within the interior of the package substrate (see FIG. 4A).

According to a specific embodiment, edges 312 and 314 of the power and ground planes are exposed on the side surface 130 of the package substrate. The exposed edges are used to electrically connect the power and ground planes to the capacitor 202. Contact pads (e.g., metal straps) may be positioned between the exposed edges and the capacitor. The contact pads are made of a conductive material so that it can be used to electrically connect the power and ground planes to the capacitor. In order to avoid shorting the decoupling capacitor, each contact pad is configured to exclusively connect to either the power plane or the ground plane. For example, see the dashed lines where the edges 312 and 314 are coupled to the contact pads 308 and 310. It will also be appreciated by those skilled in the art that other configurations can be used for electrically connecting the capacitor to the power and ground planes. For example, capacitor 202 can be connected directly to the power and ground planes without the contact pads 308 and 310.

Decoupling capacitor 202 may be constructed in a variety of ways. Typically, the decoupling capacitor includes a pair of plates separated by a dielectric material. Each plate has a different voltage potential applied to it; thereby, allowing the decoupling capacitor to store power by charging itself or distribute power by discharging itself. Depending on the application needs, the amount of capacitance (typically on the order of Micro-Farads) can be selected by using different materials and having different square areas for the plates and dielectric. Typically, the plates are made from a conductive material. Preferably, the conductive material has high electrical conductivity characteristics. Examples of conductive materials include Cu, Al, Pt, Au, etc. On the other hand, the dielectric material includes a material with a dielectric constant in the range between 10 and 1000. The dielectric material may include $SiO_2$, $Si_3N_4$, $Nb_2O_5$, $Al_2O_3$, $TiO_2$, etc. According to some embodiments, the power and ground planes in the package substrate share many characteristics of a decoupling capacitor. For example, the power and ground planes are separated by a dielectric in the substrate layers of the package substrate. As shown in FIG. 3A, capacitor 202 includes contacts 304 and 306 for electrically connecting to contact pads 308 and 310 or to edges 312 and 314.

Figure 3B:
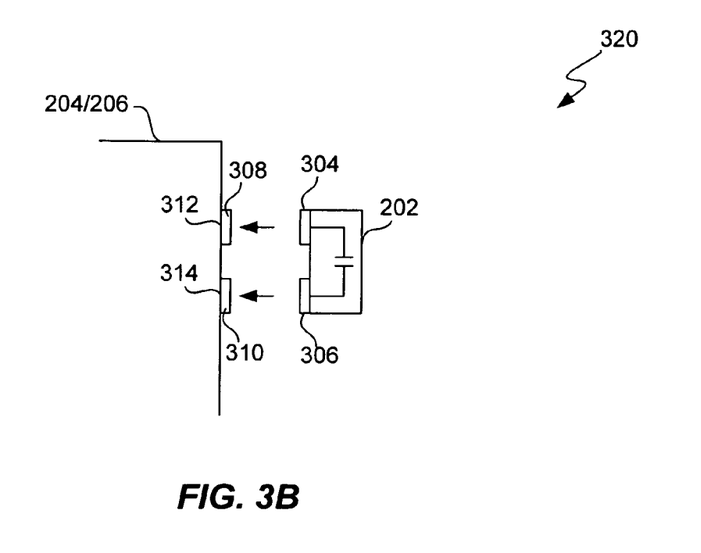
FIG. 3B illustrates a top view of a portion of power/ground planes in FIG. 3A that are adapted for coupling to a side/edge-mounted decoupling capacitor according to various embodiments of the present invention.

Next, FIG. 3B illustrates a top view of a portion 320 of power/ground planes in FIG. 3A that are adapted for coupling to a side/edge-mounted decoupling capacitor according to various embodiments of the present invention. As shown, contact pads 308 and 310 are respectively connected to the edges 312 and 314 of ground and power planes 204 and 206. Contact pads 308 and 310 are also respectively connected to contacts 304 and 306 of coupling capacitor 202.

Mounting decoupling capacitors along the substrate package's side surfaces avoids space limitation and trace routing constraints that conventional techniques currently bear when using the top or bottom surfaces of the package substrate. Mounting decoupling capacitors along substrate package's side surfaces also can make use of a plated contact pad that directly connects to power and ground planes or associated traces. As compared to conventional techniques of using vias that can introduce a relatively large ESL value, contact pads have larger contact areas that are used to connect to the power and ground planes, thereby minimizing the ESL value. As a result, decoupling performance can be substantially improved.

Figure 4A:
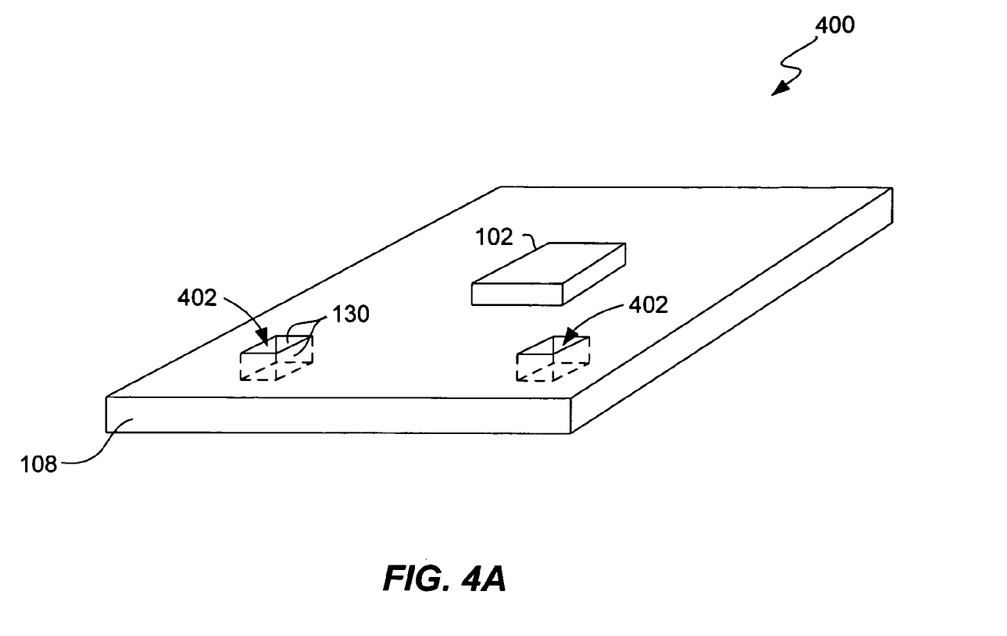
FIG. 4A illustrates a prospective view of a semiconductor device package with a substrate that includes a side/edge-mounted decoupling capacitor according to various embodiments of the present invention.

FIG. 4A illustrates a prospective view of a semiconductor device package 400 with a substrate that includes a side/edge-mounted decoupling capacitor according to various embodiments of the present invention. As mentioned earlier, side surface 130 may be located anywhere on package substrate 108. As such, sides 130 are located in cavities 402 formed in semiconductor device package 400. Mounting decoupling capacitors in a cavity also eliminate connections with traditionally implemented vias and improve decoupling performance.

Figure 4B:
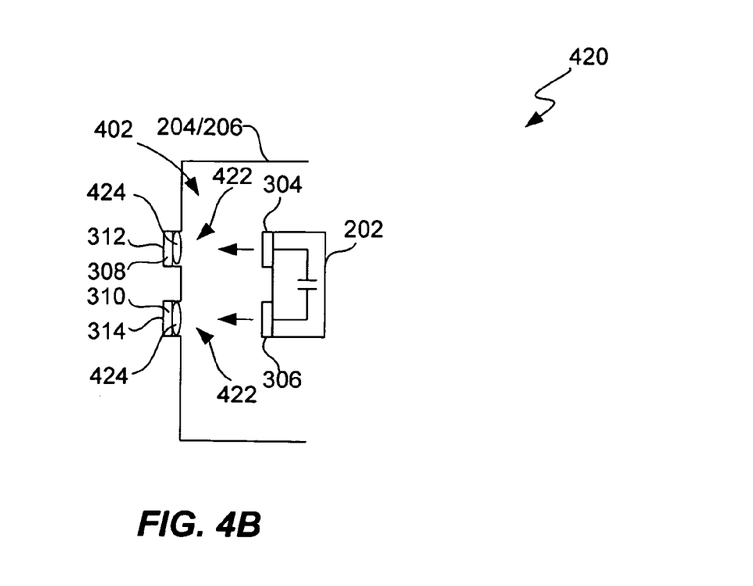
FIG. 4B illustrates a top view of a portion of power/ground planes in FIG. 4A that are adapted for coupling to a side/edge-mounted decoupling capacitor according to various embodiments of the present invention.

FIG. 4B illustrates a top view of a portion of power/ground planes in FIG. 4A that are adapted for coupling to a side/edge-mounted decoupling capacitor according to various embodiments of the present invention. As shown, edges 312 and 314 of the ground and power planes are respectively exposed within channels 422 on the side surface 130. The exposed edges are used to electrically connect the power and ground planes to the capacitor 202. Contact pads 308 and 310 may be positioned within the channels 422 and between the exposed edges (e.g., 312 and 314) and the capacitor 202. Conductive adhesive or solder 424 may be used to facilitate the electrical connection between the capacitor and the power and ground planes.

According to the present invention, the package substrate includes a side/edge-mounted decoupling capacitor that can provide decoupling capacitance in order to deliver near instant power to the die and/or minimize SSN. The near instant power is created by locating a power source (e.g., decoupling capacitor) as close as possible to the die or its components (e.g., driver, etc.); thus, resulting in a minimal time delay created by the shorter distance between the power source and die/die components. Depending on the application, the decoupling capacitor may be selectively charged or discharged. For instance, an algorithm may be used to determine the amount of charging or discharging necessary. On the other hand, the decoupling capacitor may be hardwired to charge or discharge automatically via the flip chip package's power delivery system.

SSN can also be minimized due to the shorter distance created between the power source and die/die components. In fact, whenever used by the die, the decoupling capacitor may reduce the amount of SSN that may otherwise take place. This is because of the lower inductance and resistance associated with having a shorter (in terms of distance between the capacitor and power/ground planes) and larger (in terms of the contact area between the capacitor and power/ground planes) connection. That is, a low impedance of the flip chip package's power delivery system can be achieved. Furthermore, by having a larger capacitance provided by the decoupling capacitor, there will be more opportunities to use the decoupling capacitor in place of the system power source. Therefore, by using the decoupling capacitor of the present invention, the overall amount of SSN that the flip chip package may otherwise experience (e.g., not using the decoupling capacitor) can be reduced and minimized.

Fabricating a Substrate with Decoupling Capacitors

Figure 5:
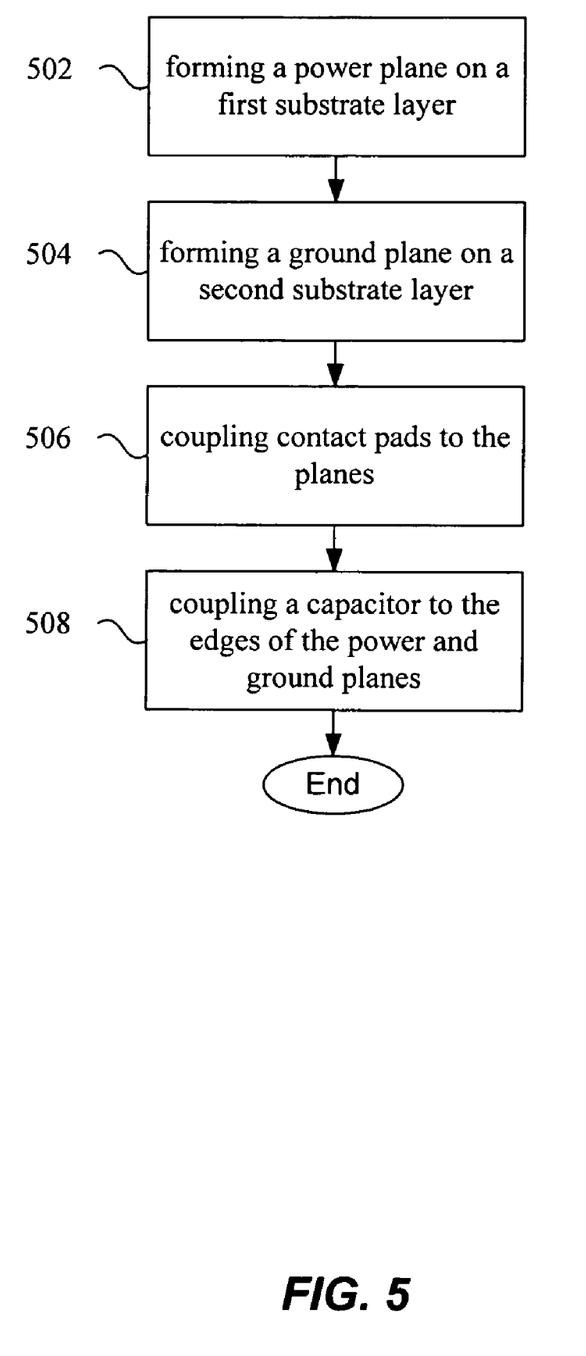
FIG. 5 illustrates a flow diagram of fabricating a substrate with a side/edge-mounted decoupling capacitor according to various embodiment of the present invention.

The package substrates described in the present invention may be constructed using any number of methods. For example, FIG. 5 illustrates a flow diagram of fabricating a substrate with a side/edge-mounted decoupling capacitor according to various embodiment of the present invention. At operation 502, forming a power plane on a substrate layer is performed. The power plane is formed such that an edge of the power plane is accessible on a side surface of the substrate layer. The power plane can be directly accessible by leaving it exposed on the side surface of the substrate layer. Alternatively, it can be indirectly accessible via interconnects, traces, or terminals connected to the power plane.

Similar to operation 502, forming a ground plane on another substrate layer is performed in operation 504. The ground plane is formed such that an edge of the ground plane is accessible on a side surface of the substrate layer. The ground plane can be directly accessible by leaving it exposed on the side surface of the substrate layer. Alternatively, it can be indirectly accessible via interconnects, traces, or terminals connected to the ground plane.

Any conventional technique may be used to form the power and ground planes in operations 502 and 504. For example, etching and deposition techniques may be used. According to one embodiment, depositing a metal layer over the substrate layer is performed to form either the power plane or the ground plane. Further, the side surface may be located on a periphery of the package substrate and/or within a cavity of the package substrate.

At operation 506, coupling contact pads to the exposed edges of the planes is performed. The contact pads are used to electrically connect the power and ground planes to the capacitor. It will be appreciated by those skilled in the art that any technique can be used to electrically connect the power and ground planes to the capacitor. For example, each contact pad is exclusively connected to either the power plane or the ground plane, thereby avoiding a short in the decoupling capacitor's circuit.

At operation 508, coupling a capacitor to the edges of the power and ground planes is performed. Any type of capacitor may be used. One example is a capsule housing type capacitor. Further, as mentioned earlier, various techniques may be used to couple the capacitor to the power and ground planes. For example, conductive adhesives or solder may be used.

It will be appreciated by persons of ordinary skill in the art that some of the process operations may be substituted, rearranged, omitted, merged, or repeated. For example, repeating operation 508 in coupling another capacitor to the power and ground planes may be performed. Hence, multiple decoupling capacitors can be implemented on the package substrate. Multiple capacitors are advantageous in efficiently providing more capacitance. This is because of the possible shorter power to ground loops and more capacitor plate surface area available. Another example is omitting operation 506 from the flow.

The foregoing invention presents many advantages over conventional semiconductor device packages that implement decoupling capacitors. For example, the present invention provides an improved flip chip package solution for providing substantially instant power and/or controlling the amount of SSN, thereby, improving the flip chip package's performance. In addition, the present invention can be implemented without substantially affecting the form factors of today's package substrates and flip chip packages. Moreover, the decoupling capacitors are not implemented within more costly package components such as the die. As a result, the present invention can be implemented without impacting the die manufacturing (MFG) yield.

Although the foregoing invention has been described in some detail for purposes of clarity of understanding, it will be apparent that certain changes and modifications may be practiced within the scope of the appended claims. Therefore, the present embodiments are to be considered as illustrative and not restrictive, and the invention is not to be limited to the details given herein, but may be modified within the scope and equivalents of the appended claims.

What is claimed is:

1. A package substrate, comprising:
   a top surface configured to receive a die;
   a bottom surface that is opposite the top surface;
   a side surface located between the top and bottom surfaces, the side surface located within a cavity of the package substrate; and
   a capacitor located on the side surface, the capacitor being electrically connected to a power plane and a ground plane that are located within the package substrate.

2. The package substrate of claim 1, wherein the package substrate comprises a plurality of substrate layers, the power and ground planes being positioned on first and second substrate layers respectively.

3. The package substrate of claim 2, wherein first and second substrate layers are positioned adjacent to each other.

4. The package substrate of claim 1, wherein a dielectric is positioned between the power and ground planes.

5. The package substrate of claim 1, wherein edges of the power and ground planes are exposed on the side surface, the exposed edges being used to electrically connect the power and ground planes to the capacitor.

6. The package substrate of claim 5, further comprising:
   contact pads positioned between the exposed edges and the capacitor, the contact pads being used to electrically connect the power and ground planes to the capacitor.

7. The package substrate of claim 6, wherein each contact pad exclusively connects to either the power plane or the ground plane.

8. The package substrate of claim 7, wherein each contact pad is a metal strap.

9. The package substrate of claim 5, wherein edges of the power and ground planes are respectively exposed within a first channel and a second channel on the side surface, the exposed edges being used to electrically connect to the capacitor.

10. The package substrate of claim 9, further comprising:
    contact pads positioned within the first and second channels and between the exposed edges and the capacitor, the contact pads being used to electrically connect the power and ground planes to the capacitor.

11. The package substrate of claim 1, wherein the capacitor connects directly to the power and ground planes.

12. The package substrate of claim 1, wherein the capacitor is electrically connected to a second power plane and a second ground plane that are located within the package substrate.

13. The package substrate of claim 12, wherein the power planes and the ground planes are components of a semiconductor device package's power delivery system, the power planes and the ground planes being made of metal.

14. A semiconductor device package, comprising:
    a package substrate, wherein the package substrate includes,
    a top surface;
    a bottom surface that is opposite the top surface;

a side surface located between the top and bottom surfaces, the side surface located within a cavity of the package substrate; and a capacitor located on the side surface, the capacitor being electrically connected to a power plane and a ground plane that are located within the package substrate; and a die having active and inactive surfaces, the die being positioned on the top surface and electrically connected to the packaging substrate.

15. The semiconductor device package of claim 14, further comprising:

a heat spreader connected to one of the inactive surfaces of the die and to the top surface of the package substrate.

16. The semiconductor device package of claim 14, wherein the die is a flip chip.

* * * * *